United States Patent [19]

Rosky

[11] Patent Number: 4,835,420
[45] Date of Patent: May 30, 1989

[54] METHOD AND APPARATUS FOR SIGNAL LEVEL CONVERSION WITH CLAMPED CAPACITIVE BOOTSTRAP

[75] Inventor: David S. Rosky, Encinitas, Calif.

[73] Assignee: Applied Micro Circuits Corporation, San Diego, Calif.

[21] Appl. No.: 121,612

[22] Filed: Nov. 17, 1987

[51] Int. Cl.[4] .......................................... H03K 19/013
[52] U.S. Cl. .................................... 307/475; 307/446; 307/454; 307/482; 307/246
[58] Field of Search ................ 307/446, 454, 455–456, 307/475, 482, 494, 246, 264, 549, 296 R

[56] References Cited

U.S. PATENT DOCUMENTS

| | | | |
|---|---|---|---|
| 3,573,488 | 4/1971 | Beelitz | 307/207 |
| 3,755,693 | 8/1973 | Lee | 307/237 |
| 3,766,406 | 10/1973 | Bryant et al. | 307/203 |
| 3,974,402 | 8/1976 | Fett et al. | 307/264 |
| 4,347,446 | 8/1982 | Price | 307/443 |
| 4,437,171 | 3/1984 | Hudson et al. | 365/177 |
| 4,453,095 | 6/1984 | Wrathall | 307/475 |
| 4,539,493 | 9/1985 | Varadarajan | 307/455 |
| 4,563,601 | 1/1986 | Asano et al. | 307/475 |
| 4,626,709 | 12/1986 | Mazumder et al. | 307/446 X |
| 4,629,913 | 12/1986 | Lechner | 307/475 |
| 4,649,294 | 3/1987 | McLaughlin | 307/446 |
| 4,680,480 | 7/1987 | Hopta | 307/270 |
| 4,687,953 | 8/1987 | Varadarajan | 307/454 X |
| 4,694,203 | 9/1987 | Uragami et al. | 307/448 X |
| 4,724,343 | 2/1988 | Le Roux et al. | 307/475 |

OTHER PUBLICATIONS

Dansky et al., "Active Pull-Down Circuit for Current-Controlled Gate", IBM T.D.B., vol. 24, No. 11A, Apr. 1982, pp. 5613–5618.

*Primary Examiner*—David Hudspeth
*Attorney, Agent, or Firm*—Baker, Maxham, Jester & Meador

[57] ABSTRACT

A method and apparatus for converting input signals at one predetermined logic level to output signals at corresponding different logic levels includes differential amplification of input signals with a first output of a differential amplifier connected for establishing a voltage level between voltage limits $V_{cc}$ and $V_{ee}$ at the output of an output driver in response to variations in amplifier output. A pull-down transistor has a collector connected to the output driver output, an emitter connected to the $V_{ee}$ voltage source, and a base capacitively coupled to the second amplifier output. In further aspects of the invention, a voltage clamp embracing a transistor with a base connected to receive a predetermined control voltage has an emitter connected to the pull-down transistor base and a collector connected to the $V_{cc}$ voltage source.

9 Claims, 2 Drawing Sheets

METHOD AND APPARATUS FOR SIGNAL LEVEL CONVERSION WITH CLAMPED CAPACITIVE BOOTSTRAP

BACKGROUND OF THE INVENTION

1. Field of the Invention

The present invention relates to circuits for converting Emitter-Coupled-Logic (ECL) level signals into corresponding Bipolar-CMOS (BICMOS) level signals and more particularly to a method and apparatus for level conversion employing a capacitively coupled pull-down circuit connected across an output load. The invention further relates to a method and apparatus for generating high speed trailing edge transitions employing a capacitively coupled bootstrap driver having an input connected to one output of a differential current switching device.

2. Background of the Art

Circuitry used in advanced integrated circuits often employs several different families or types of logic circuits to take advantage of specific operating features or parameters. That is, ECL, TTL, BICMOS, and other types of logic circuits each have inherent operating features in terms of input impedance, power dissipation, voltage levels required, output impedance, etc. that make them well suited to particular switching or logic operations. Therefore, circuits such as ECL logic elements, which are well suited as high speed switching components with low input impedances, are often used in conjunction with TTL circuit elements which drive high current loads, or BICMOS elements which dissipate very little power and provide excellent output impedances.

However, the different logic types or families operate at incompatible signal levels, requiring signal level converters to transfer signals between and through an overall circuit. Therefore, it is necessary to be able to efficiently convert from one signal level, say ECL, to another level, say BICMOS, at high signal transfer rates to take full advantage of the characteristics of the separate circuit elements. Exemplary circuits for accomplishing these type of conversions are shown in U.S. Pat. Nos. 4,453,095, 4,347,446, 4,629,913, and 3,766,406.

A major problem in converting between different types of logic or signal levels is the fact that successive circuit elements or stages often act as large capacitive loads for the converter, especially with BICMOS and TTL circuit elements. This large capacitive load produces signal propagation delays and effects the decay times between signal level transitions. The trailing edges of digital pulse signals become sloped and extended over a longer period instead of having a desired sharp (short period) transition. This causes general signal distortion and processing problems in later stages.

In an attempt to solve the transition problems a pull-down or boost circuit can be employed to assist the converter in removing the voltage stored in the large capacitance of the load circuit. One type of pull-down element is shown in U.S. Pat. Nos. 4,629,913 and 3,766,406, where a pull-down transistor is placed across the output load in order to pass current from the load to the lowest circuit potential. However, the pull-down transistors in these inventions continue to draw the pull-down current even after the output falls to a low state. The power dissipated by this extra current is very undesirable.

In U.S. Pat. No. 4,347,446, the pull-down transistor is referenced to an independent voltage source which is controlled to bias the pull-down transistor in the off state when the output signal is in low state. While this decreases the current requirement during the low state period it increases the complexity of the overall circuit and requires a third, programmable, high-current voltage source. This adds complexity and undesirable switching speed complications. This circuit also is incapable of generating both true and complementary outputs simultaneously, which is very important in modern ULSI.

Other techniques have included the addition of resistors and diodes to act as current paths during signal transitions to reduce the voltage inherently stored by the capacitance of current from the output load. However, all of these techniques have proven unsatisfactory in terms of power consumption or undue complexity.

What is needed is a method and apparatus for improving the transition behavior of logic level converters which requires minimum circuit alteration or structure and is very efficient at high signal rates.

SUMMARY OF THE INVENTION

In view of the above summarized problems of the existing art, it is a purpose of the present invention to provide an apparatus and method for converting from one logic signal level to a second logic signal level with faster voltage pull-down response.

A distinct advantage of the present invention is the provision of a method and apparatus for improving trailing edge response in circuits employing an amplifier stage having two complementary outputs.

Another purpose of the present invention is to provide an apparatus and method for converting from ECL level signals to BICMOS level signals with improved trailing edge response.

Another advantage of the present invention is that it provides ECL level signal to BICMOS level signal conversion using an efficient circuit design of low complexity.

Yet another advantage of the present invention is found in the provision of improved trailing edge response for signal level conversion while low steady state current loads are maintained.

These and other purposes, objects, and advantages of the present invention are achieved in an apparatus for converting input signals at Emitter-Coupled-Logic (ECL) levels to output signals at corresponding Bipolar-CMOS (BICMOS) levels. This apparatus includes a differential amplification means for receiving and amplifying input ECL level signals having a first input for the ECL level signals and a second input for a reference signal, and first and second outputs, and being connected to an upper voltage level source $V_{cc}$ and a lower level voltage source $V_{ee}$. An output follower means also connected to the $V_{cc}$ voltage source, is connected to receive an output signal from the first amplification means output, for establishing a voltage level between $V_{cc}$ and $V_{ee}$ at a driver output in response to variations in amplification output. A bootstrap transistor has a collector connected to the driver output and an emitter connected to the $V_{ee}$ voltage source with a base input capacitively coupled to the second amplification output.

In further aspects of the invention, a current control means is connected to the differential amplification means and the $V_{cc}$ and $V_{ee}$ voltage sources for limiting the current transferred by the amplification means. A voltage clamp comprising a transistor having a base connected to the current control means has an emitter connected to the bootstrap transistor base and a collector connected to the $V_{cc}$ voltage source. The output follower comprises a transistor having a collector connected to the $V_{cc}$ voltage source and an emitter connected to a driver output, which is coupled to an output load, and a base connected to the first amplification output.

DETAILED DESCRIPTION OF A PREFERRED EMBODIMENT

The novel features of the present invention may be better understood from the accompanying description when taken in conjunction with the accompanying drawings in which like characters refer to like parts and in which.

DETAILED DESCRIPTION OF A PREFERRED EMBODIMENT

The present invention provides a method and apparatus for improving the trailing edge response of logic circuits coupled into substantially large capacitive loads where the logic circuits incorporate at least one differential type amplification stage. The present invention more particularly provides an apparatus and method for converting Emitter-Coupled-Logic (ECL) level input signals to Bipolar-CMOS (BICMOS) level output signals with faster trailing edge voltage level switching resulting in improved output signals. The present invention achieves this by providing a differential current source or signal level amplifier having at least two complementary outputs, one o which is connected to a capacitive load output current driver for generating the appropriate logic level output signals in response to input signals of a different logic signal level. An active current switch is positioned across the output load and has a capacitively coupled control input connected to the second, complementary, output of the differential amplifier stage. A voltage clamp is connected to the control input to limit the negative excursion of the base of the current switch during a high-to-low transition of the second amplifier output, greatly reducing the recovery time of the circuit.

Figure 1:
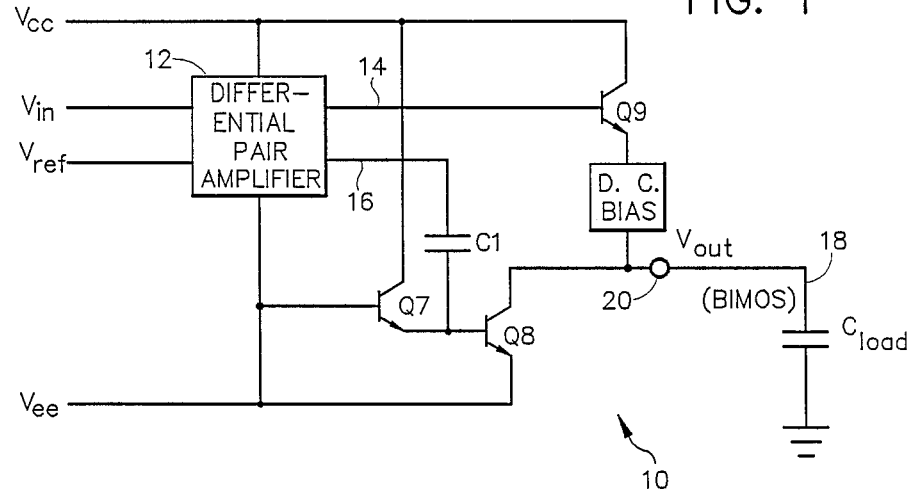
FIG. 1 illustrates a schematic view of an ECL to BICMOS level conversion circuit constructed according to the principles of the present invention.

A method utilized by the present invention to reduce the charge retained by the capacitance of an output circuit load is better described with reference to a basic signal processing circuit as illustrated in FIG. 1. In FIG. 1, an input signal $V_{in}$, such as, but not limited to, an ECL level signal is input to the conversion circuit 10 where it is amplified or buffered using an amplifier circuit 12.

The amplifier 12 is connected between a "high" voltage level source $V_{cc}$ and a "low" voltage level source $V_{ee}$ which also represent the highest and lowest voltage levels obtained by the final output signal, minus voltage drops across switching elements or impedances inherent to a particular output driver. Therefore, $V_{cc}$ and $V_{ee}$ are chosen according to the logic signal level requirements, BICMOS, CMOS, TTL, DTL, etc., for the output of the circuit 10.

The method of the present invention comprises receiving an input signal and amplifying or buffering (amplification is (1) it at the input signal logic levels to prevent loading the input signal source. This amplified signal is then used to control an output current provided by an output driver at the desired voltage levels. It can be readily seen that this aspect of the method and apparatus are not dependent upon the specific voltage levels chosen for particular logic levels or families but is applicable to a variety of input and output signal voltage levels or logic types.

The amplifier 12 of the converter 10 of FIG. 1 comprises a differential amplifier having two complementary outputs, one of which is generally used to control the flow of current through a subsequent output follower or current driver element Q9. The differential amplifier 12 is a circuit well known in the art of electronics for receiving an input signal at one voltage and current level and increasing the current or voltage level as an output.

One amplifier output, 14, of the amplifier 12 generates a high voltage level output (close to $V_{cc}$) when the voltage level of the input signal $V_{in}$ is higher than a reference input signal $V_{ref}$ and a low voltage level (close to $V_{ee}$) when the input signal $V_{in}$ has a lower voltage than the reference signal $V_{ref}$. A second amplifier output, 16, generates the opposite voltage level, low and high, to the first output 14.

The first amplifier output 14 is connected to an output driver which acts as a current driver for a load circuit 18 connected to the output point 20. A typical output driver comprises an emitter follower transistor, Q9, although more complicated circuitry can be employed. The amplifier output 16 is typically not used in the prior art for driving an output signal. The output driver Q9 is controlled by the output of the amplifier 12 to generate a high level signal in response to a high level present in $V_{in}$ and a low level signal in response to a low level in $V_{in}$ but at the new $V_{cc}$ and $V_{ee}$ signal levels. In this manner an input signal at one logic level is altered to new desired voltage levels.

Figure 3:
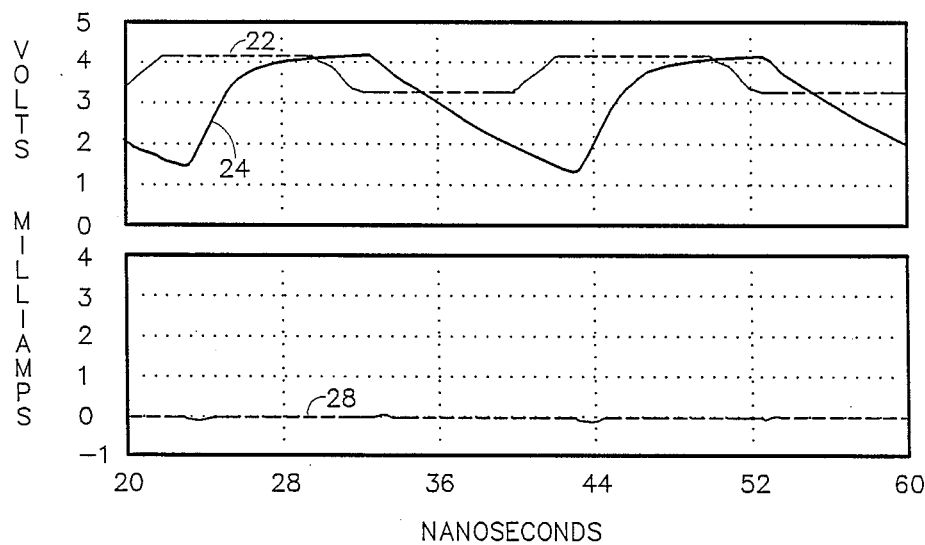
FIG. 3 illustrates typical voltage and current waveforms for input and output signals from the circuit of FIG. 2 without boosting.

However, changes in output current do not bring about immediate changes in the voltage levels seen at the output point 20 because the large capacitance of the load retains charge and creates a longer decay time. The impact of the delay in the decay time for the output voltage is shown in FIG. 3a where a signal in the form of a series of square input pulses 22 are translated into output pulses 24 having sloping edges.

To alleviate this problem, a circuit is applied to the output point 20 in order to discharge the voltage on the capacitive load, that is, to pull-down the load quickly. While a simple, passive, impedance element can be added, such an impedance is in the system during all phases of signal conversion or processing. Therefore, this requires more current output from the transistor Q9 and the voltage source $V_{cc}$ to compensate during all phases of the output signal, including steady state voltage levels.

As discussed above, to assist the output current driver Q9 in pulling up or down the voltage of the capacitive load 18, a series of elements such as totem pole diodes or the like can be positioned between the output 20 and $V_{cc}$ or $V_{ee}$. However, these elements either require additional current from the $V_{cc}$ source or independent input voltage sources which are undesirable.

The method of the present invention circumvents these problems by boosting or switching additional current between the output point 20 and the lower $V_{ee}$ voltage source only during the transient level change phase of output pulses so as to assist in pulling down the capacitive load 18. This is achieved by using the complementary output of the differential amplifier 12 to activate a current drain or switch.

For the method of the present invention, an active current switch in the form of a bootstrap transistor Q8 is used to short the capacitive load 18 to the $V_{ee}$ level. The collector of the transistor Q8 is connected to the output point 20 and the emitter to the $V_{ee}$ voltage source. The base of the bootstrap transistor Q8 then receives a signal from the amplifier output 16 to set its operating state, or turn it on and off.

However, it is only desirable to have the current switch Q8 activated or conductive during signal level transitions and not during steady state signal level output. Therefore, the current switch is capacitively coupled to the output 16 so that only a changing voltage level (transient or transition) on the second amplifier output 16 provides activation of the current switch Q8. This is accomplished by placing a capacitor C1 between the output 16 and the base of the transistor Q8.

In this manner only signals during changing levels but not steady state are transferred across the capacitive coupler C1, and only those signals for when the output is dropping. This allows the transistor to be varied in operation to present no current load during steady state operation, that is when the pulse is at its maximum or minimum, but assist in current drain (pull-down) during signal transitions.

To prevent saturation of the current switch or transistor Q8 and discharge the capacitor C1 for operation during the next transition, a voltage clamp is positioned to provide a fixed minimum voltage to the base of the transistor Q8. A preferred voltage clamp comprises a clamping transistor Q7 having a collector connected to the voltage source $V_{cc}$ and an emitter connected to the base of the transistor Q8. The transistor Q7 receives an input control voltage on its base from a substantially fixed voltage reference source. Other elements can be used to bias the base of the transistor Q8 such as a voltage divider network but an active component is preferred. In addition, as discussed below, other current limiters and DC bias elements can be employed where desired in the converter 10.

Figure 2:
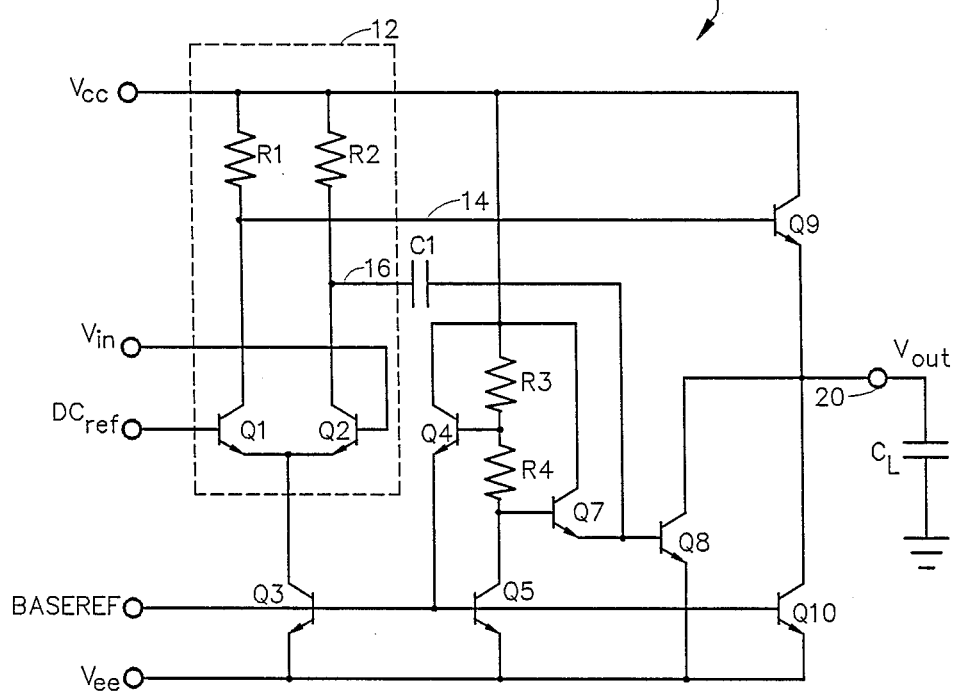
FIG. 2 illustrates one detailed embodiment of the circuit of FIG. 1.

An apparatus constructed according to the principles of the present invention and operating according to the method of the present invention is presented in FIG. 2. FIG. 2 presents a more detailed schematic form of a preferred embodiment of an ECL to BICMOS level conversion circuit 10' implementing the inventive elements shown in FIG. 1. However, the specific signal levels employed, as well as circuit functions are for purposes of illustration and it will be readily understood by those skilled in the art that alterations can be made without departing from the teachings of the present invention.

In FIG. 2, a pair of transistors, Q1 and Q2 have their emitters connected together to form the differential amplifier or current switch 12 in which only one transistor conducts at any time, that being the one with the higher base potential. For ease of illustration the transistors Q1 and Q2 are illustrated as standard NPN transistors although other types of transistors, such as FETs, PNPs, etc., can also be employed in particular applications.

The emitters of these transistors are connected to a current source Q3 which is connected to $V_{ee}$, the negative or low potential voltage source for the converter 10'. The collectors of the transistors Q1 and Q2 are connected through the resistors R1 and R2, respectively, to the voltage source $V_{cc}$ which is the upper level voltage limit for the converter 10'. The resistors R1 and R2 determine the variation or swing in voltage provided as an output from the pair by providing a voltage drop from the $V_{cc}$ level.

The voltage source $V_{cc}$ typically comprises a well regulated voltage source delivering voltages in the range of about $-0.7$ to $+5.1$ volts, depending on the type of logic signals being output, at currents determined by power consumption restrictions imposed on the converter 10' and associated circuits. The voltage source $V_{ee}$ typically comprises a well regulated voltage source delivering voltages in the range of about $-5.2$ to $0.0$ volts. A typical BICMOS output requires a voltage in the range of about $-0.2$ to $0.0$ volts for $V_{cc}$ and between about $-5.2$ and $-5.0$ for $V_{ee}$. However, the specific voltages and currents depend on known design requirements for either the input or load circuits and are altered for specific applications.

The emitters of the transistors Q1 and Q2 are preferably connected to the lower voltage level source, $V_{ee}$, through a current control transistor Q3. Transistor Q3 acts as a constant current source for the transistors Q1 and Q2 and limits the amount of current the transistors Q1 and Q2 pass which in turn limits the current output to subsequent circuit stages as well as preventing undue loading of the voltage sources $V_{cc}$ and $V_{ee}$.

A pair of transistors Q4 and Q5 form a current reference for the differential pair Q1, Q2 and the output driver Q9. These two transistors regulate the current allowed by transistor Q3. Transistor Q4 has a collector connected to the voltage source $V_{cc}$, an emitter connected to the base of transistors Q3, Q5 and Q10 and a base connected to a pair of resistors R3 and R4. The resistors R3 and R4 are placed between the base and collector of transistor Q4 and between the base of Q4 and the collector of the transistor Q5 and form a voltage divider network. These resistors bias the transistor Q4 to provide a predetermined output voltage on the transistor emitter to control current limits of the transistors Q3 and Q5.

The differential amplifier pair 12 provides an output based upon the differential in the input level between the bases of the two transistors Q1 and Q2. That is, when the levels at their respective bases differ there is a "high" level output produced at one of the two transistor collectors depending on which base voltage is larger. By assigning the input signal $V_{in}$ to one transistor base and a DC reference voltage to the second transistor base, an output signal is generated on the collector of the second transistor whose state or level is dependent on whether the input signal voltage is higher or lower than the reference. The DC reference voltage represents a threshold level which the input signal $V_{in}$ must exceed before an output signal results from the collector of the second transistor of the differential pair.

In the preferred embodiment, the base of Q1 is connected to a fixed reference voltage $DC_{ref}$ which is approximately $2V_{be}$ where $V_{be}$ is the diode potential across the base-emitter portion of the transistor Q1. The base of Q2 receives a level shifted ECL input which is generally symmetrical about the $DC_{ref}$ voltage level. The current in the differential pair is chosen such that the collector of Q1 swings from $V_{cc}$, minus the R1 voltage drop, when Q1 is off and Q2 is on, to $V_{ee}+2V_{be}$ when Q1 is on and Q2 is off.

The input signal $V_{in}$ activates the transistor Q1 only if it drops below $V_{ee}+2V_{be}$. This turns transistor Q2 off and Q1 on and passes current between the $V_{ee}$ and $V_{cc}$ voltage sources. The end of the resistor R1 connected to the collector of the transistor Q1 experiences a drop in voltage level until it obtains the steady state value of $V_{ee}+2V_{be}$ When the input signal exceeds the value $V_{ee}$ by $2V_{be}$ the transistor Q2 turns on and the transistor Q1 turns off. The voltage of the Q1 collector rises until it reaches a maximum or steady state output value of $V_{cc}-R1I1$, where I1 is the base and leakage current through the resistor R1.

The converter 10' output is provided by a level shifter or output follower transistor Q9 which acts as a current driver for the load 18 and passes current from the higher voltage source $V_{cc}$ to the load and to the lower voltage source $V_{ee}$ The transistor Q9 has a collector connected to the voltage source $V_{cc}$ and an emitter connected to a converter 10' output point 20'. The output of the emitter follower Q9 varies from $V_{cc}-V_{be}$ when Q1 is turned off to $V_{ee}+V_{be}$ when Q1 is turned on, which represents the required BICMOS output level used.

The output point 20 is preferably maintained at a DC bias level above $V_{ee}$ by one of several means. While a resistor can be employed, it is more advantageous to use a transistor to obtain the proper DC bias level. In the preferred embodiment, a transistor Q10 is employed with a collector connected to the output point 20 and an emitter connected to the $V_{ee}$ voltage source. The base of the transistor Q10 is connected to the emitter of the transistor Q4 which drives the current source Q3 and sets a predetermined constant current in the collectors of the transistors Q3 and Q5.

Variations in the the input ECL signal level change the voltage at the collector of the transistor Q1 which alters the current flow through the output follower or level driver transistor Q9. This in turn alters the current and voltage provided across the output 20. A rise in the ECL pulse to its maximum, steady state, level also causes the output level of the converter 10' to rise to its maximum steady state output level When the ECL signal level decreases, the output level of the converter 10' also decreases to a low steady state level.

However, as before, voltage stored in the parasitic or inherent capacitances of the load circuit 18 prevents the output of the converter 10' from making a fast transition from high to low voltage levels. The output follower Q9 does not provide an adequate current drain to remove the excess charge.

The transistor Q9 exhibits good pull-up capability with the output load 18 because of the transistor beta and the ability to draw on the current of the $V_{cc}$ source to charge the capacitance of the load. However, the only current available to pull the output voltage down is the bias current provided by Q10. Since this is normally a DC referenced current source no beta amplification is available and the current provided is limited to that of the bias source. As previously discussed, it is undesirable to make the DC bias current large in order to handle this pull-down requirement since this represents an increased current level that is always present, even when the output signal is not switching levels.

In order to solve the above problem, a transistor Q8 is used to provide additional pull-down current when required during switching without consuming extra DC bias current during steady-state. The collector of the transistor Q8 is connected to the output point 20 or, in this application, the emitter of the transistor Q9 and its emitter to the $V_{ee}$ supply. This arrangement provides a current path directly between the output point 20 and the $V_{ee}$ voltage level. The base or current control for the transistor Q8 is coupled to the second output of the transistor pair, or the collector end of the transistor Q2. This means that when the transistor Q2 is off or not conducting, the transistor Q8 base is raised above the $V_{ee}$ level which turns the transistor Q8 on and creates a current drain or path between the output 20 and the low potential $V_{ee}$.

However, this current switch is only desired for transitions and not steady state operation. Therefore, the base of the transistor Q8 is connected to the collector of the transistor Q2 through a capacitor C1. The effect of this capacitive coupling is that only varying voltage levels at the collector of the transistor Q2 will be transferred to the base of the transistor Q8. This occurs only when the signal at the input drops below the $DC_{ref}$ level which occurs during down-going transitions. When the circuit is at a steady state level, that is, either Q1 or Q2 are on and the voltages at R1 and R2 are unchanging, then no signal crosses C1. During steady state operation, the voltage at the transistor Q2 collector does not transfer across the capacitance and the base of the transistor Q8 remains unchanged and no current flows through the transistor Q8 from the output point 20.

When the collector voltage of the transistor Q2 rises and the transistor Q1 collector voltage is falling and the output voltage from Q9 is also falling, a displacement current flows through the capacitor C1 and to the base of Q8. This current is amplified by the transistor Q8 and aids in quickly discharging the load 18 capacitance $C_L$.

At the same time, the base of the transistor Q8 is connected to the emitter of a transistor Q7 which is used as a voltage clamp for the base of the transistor Q8. The transistor Q7 has a collector connected to the $V_{cc}$ voltage source and a base connected to the current limiter transistor Q5 to provide a fixed voltage level at the base of the transistor Q8. The transistor Q7 acts as a voltage clamp to discharge the capacitor C1 during the falling edge of the transistor Q2 collector (rising $V_{out}$). This limits the voltage swing at the base of Q8 and ensures that C1 is ready on the next signal transition to provide displacement current on the next rising edge of the collector voltage for the transistor Q2.

Figure 4:
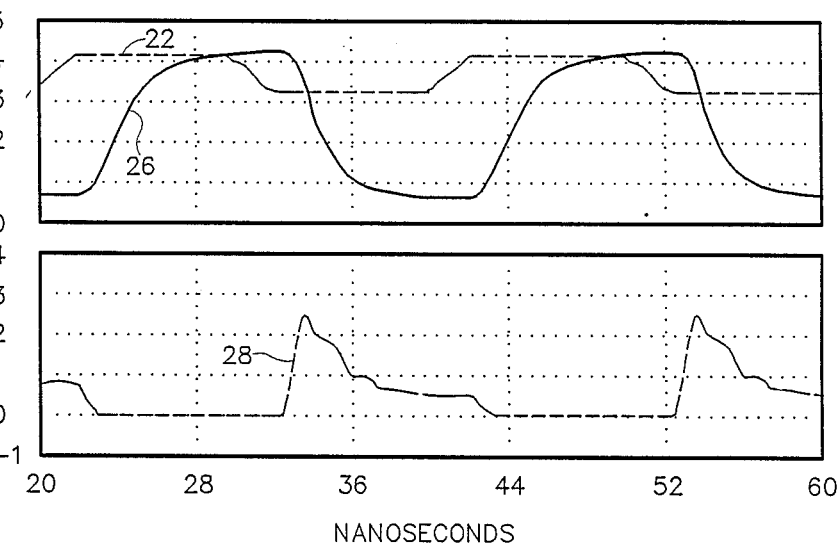
FIG. 4 illustrates typical voltage waveforms for output signals corresponding to FIG. 3, and typical current waveform for current in the boost portion of the circuit of FIG. 2 during output.

The results of employing the transistors Q7 and Q8 in combination with the capacitor C1 are seen in FIG. 4 where input and output waveforms are illustrated. In FIG. 4, an input ECL level signal shown as waveform 22 is converted to the output BICMOS level waveform 26. The current transferred though the transistor Q8 is illustrated as the waveform 28 and shows the rapid response of the current drain for the output as well as the quick shut off for steady state operation.

What has been described then is a new capacitively coupled voltage pull-down circuit for improving the transition or switching response of the output for various circuits employing a differential amplification stage.

The foregoing description of preferred embodiments has been presented for purposes of illustration and description. It is not intended to be exhaustive nor to limit the invention to the precise forms disclosed, and many modifications and variations are possible in light of the above teaching The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. An apparatus for converting input signals at Emitter-Coupled-Logic (ECL) levels to output signals at corresponding Bipolar-CMOS (BICMOS) levels, comprising:
   a $V_{cc}$ voltage source;
   a $V_{ee}$ voltage source;
   differential amplifier means with a first and a second output for amplifying the current level of said input signals and for producing at said first output a first output signal representing said amplified current level and for generating at said second output a second output signal representing the complement of said first output signal;
   a capacitive driver output;
   output driver means connected to said $V_{cc}$ voltage source and to said first output, for shifting said first output signal to a voltage level between $V_{cc}$ and $V_{ee}$ and providing said shifted first output signal at said capacitive driver output;
   a bootstrap transistor having a base, a collector connected to said driver output, and an emitter connected to said $V_{ee}$ voltage source; and
   capacitive transfer means connecting said bootstrap transistor base to said second output for causing said bootstrap transistor to conduct current to discharge said capacitive driver output in response to variations in said second output signal.

2. The apparatus of claim 1 further comprising voltage clamping means connected to said bootstrap transistor base for establishing a predetermined non-conducting voltage level at said bootstrap transistor base.

3. The apparatus of claim 2, wherein said voltage clamping means comprises a second transistor having an emitter connected to said bootstrap transistor base, a collector connected to said $V_{cc}$ source, and a base connected to said current control means.

4. The apparatus of claim 1 further comprising current control means connected to said differential amplifier means, and said $V_{cc}$ and $V_{ee}$ voltage sources, for limiting said current level.

5. The converter of claim 4 wherein said current control means comprises:
   a voltage divider, comprising a first resistor connected to said $V_{cc}$ source on one end, and a second resistor connected in series with said first resistor, a first end of said second resistor being joined to a second end of said first resistor at a junction;
   a first current transistor having a collector connected to a second end of said second resistor and an emitter connected to said $V_{ee}$ voltage source;
   a second current transistor having a collector connected to said $V_{cc}$ voltage source, a base connected to said resistor junction, and an emitter connected to a base of said first current transistor; and
   a control transistor having a base connected to said second current transistor base, a collector connected to said differential amplifier means, and an emitter connected to said $V_{ee}$ source.

6. The converter of claim 1 further comprising DC bias means connected between said capacitive driver output and said $V_{ee}$ source for establishing a predetermined minimum voltage level at said capacitive driver output.

7. An apparatus for converting input signals at Emitter-Coupled-Logic (ECL) levels to output signals at corresponding Bipolar-CMOS (BICMOS) levels, comprising:
   a $V_{cc}$ voltage source;
   a $V_{ee}$ voltage source;
   a differential amplifier pair comprising first and second transistors each having a base, collector and emitter, said emitters being connected together, said collectors each connected to receive current from a voltage source $V_{cc}$, said first transistor base connected to receive ECL input signals and said second transistor base connected to receive a predetermined reference voltage;
   a third transistor connected at a collector to said said amplifier pair emitters and at an emitter to another voltage source $V_{ee}$;
   a fourth transistor having first and second resistors connected between a base and a collector and an emitter respectively, being further connected at said emitter to a base of said third transistor and to said $V_{cc}$ source at said collector, so as to form a current source for said differential pair with said third transistor;
   a fifth transistor connected at a collector to said $V_{cc}$ voltage source and at an emitter to an output junction and being connected at a base to said first output of said differential pair;
   a sixth transistor connected at a collector to said output junction and at an emitter to said $V_{ee}$ voltage source, being connected at a base to said third transistor base; and
   a capacitive boost circuit comprising
      at least one capacitor connected in series with said second output of said differential pair;
      a seventh transistor connected at a collector to said output junction, at an emitter to said $V_{ee}$ voltage source, and at a base to an output of said capacitor; and
      an eighth transistor connected at a collector to said base of said seventh transistor, at an emitter to said $V_{ee}$ voltage source, and by a base to the emitter of said fifth transistor.

8. A method of depleting charge accumulated in the capacitance of a load connected to a circuit output node of a circuit, where said circuit comprises at least one signal processing stage having a differential amplifier with complementary amplifier output nodes and is connected to upper and lower voltage level sources, $V_{cc}$ and $V_{ee}$ respectively, and wherein said circuit also comprises a transistor connected to said output node, said method comprising the steps of:
   generating circuit output signals at said circuit output node in response to a first signal at a first one of said complementary amplifier output nodes, said circuit output signals charging said load capacitance;
   actively clamping the base of said transistor to a voltage level which prevents saturation of said transistor;

capacitively conducting a second signal from the second of said complementary amplifier output nodes to the base of said transistor; and generating a discharge current through said transistor at said circuit output node for discharging said load capacitance in response to said capacitive conduction.

9. In a circuit including a differential amplifier with first and second amplifier outputs, which produces complementary signals at said first and second outputs in response to a input signal, and an output emitter follower circuit connected to said first amplifier output for level-shifting a first one of said output signals at a circuit output, said output emitter follower circuit including an active current element connected to said circuit output, an improvement comprising:

capacitative transfer means connecting said active current element to said second amplifier output for causing said active current element to conduct pull-down current at said circuit output in response to variations in said second output signals; and an active voltage clamping means connected to said capacitative transfer means and to said active current element for preventing saturation of said active current element while providing for discharge of said capacitative transfer means.

* * * * *

UNITED STATES PATENT AND TRADEMARK OFFICE
CERTIFICATE OF CORRECTION

PATENT NO. : 4,835,420
DATED : May 30, 1989
INVENTOR(S) : DAVID S. ROSKY

It is certified that error appears in the above-identified patent and that said Letters Patent is hereby corrected as shown below:

Claim 5, Column 9, Line 55, please change "converter" to --apparatus--; and
Claim 6, Column 10, Line 5, please change "converter" to --apparatus--.

Signed and Sealed this

Tenth Day of July, 1990

Attest:

HARRY F. MANBECK, JR.

*Attesting Officer*   *Commissioner of Patents and Trademarks*